(12) United States Patent
Braun et al.

(10) Patent No.: US 7,200,032 B2
(45) Date of Patent: *Apr. 3, 2007

(54) MRAM WITH VERTICAL STORAGE ELEMENT AND FIELD SENSOR

(75) Inventors: Daniel Braun, Paris (FR); Richard Ferrant, Esquibien (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 139 days.

This patent is subject to a terminal disclaimer.

(21) Appl. No.: 10/923,651

(22) Filed: Aug. 20, 2004

(65) Prior Publication Data

US 2006/0039187 A1 Feb. 23, 2006

(51) Int. Cl.
*G11C 11/00* (2006.01)

(52) U.S. Cl. ........................ 365/158; 365/171; 365/173

(58) Field of Classification Search ................ 365/158, 365/171, 173

See application file for complete search history.

(56) References Cited

U.S. PATENT DOCUMENTS

| 6,545,906 | B1 | 4/2003 | Savtchenko et al. | |
|---|---|---|---|---|
| 6,664,579 | B2 * | 12/2003 | Kim et al. | 257/296 |
| 6,803,619 | B2 * | 10/2004 | Hosotani et al. | 257/295 |
| 6,909,630 | B2 * | 6/2005 | Tsang | 365/158 |
| 7,092,284 | B2 * | 8/2006 | Braun et al. | 365/158 |
| 2003/0137870 | A1 | 7/2003 | Saito et al. | |
| 2004/0037109 | A1 | 2/2004 | Witcraft et al. | |
| 2004/0057295 | A1 | 3/2004 | Matsukawa et al. | |
| 2004/0057303 | A1 | 3/2004 | Bloomquist et al. | |
| 2006/0039185 | A1 * | 2/2006 | Braun et al. | 365/158 |
| 2006/0039186 | A1 * | 2/2006 | Braun et al. | 365/158 |

FOREIGN PATENT DOCUMENTS

| DE | 1 387 400 | 3/2006 |
|---|---|---|
| EP | 10 2005 034 665 | 3/2003 |

OTHER PUBLICATIONS

German Office Action dated Aug. 14, 2006. (4 pgs.).

* cited by examiner

*Primary Examiner*—Anh Phung
*Assistant Examiner*—Hien Nguyen
(74) *Attorney, Agent, or Firm*—Dicke, Billig & Czaja, PLLC

(57) ABSTRACT

A magnetic memory element comprising a magnetic storage element having at least one magnetic layer made of a magnetic material and being vertically oriented relative to a wafer surface on which the magnetic memory element is formed, the magnetic layer having a magnetic anisotropy with its magnetization vector being magnetically coupled to at least one current line, and a magnetic sensor element for sensing the magnetization of the at least one magnetic layer of the magnetic storage element comprising at least one magnetic layer having a magnetization vector being magnetically coupled to the magnetization vector of the at least one magnetic layer of the magnetic storage element, the magnetic sensor element being conductively coupled to the at least one current line.

25 Claims, 5 Drawing Sheets

MRAM WITH VERTICAL STORAGE ELEMENT AND FIELD SENSOR

CROSS-REFERENCE TO RELATED APPLICATIONS

This Patent Application is also related to Utility patent application Ser. No. 10/922,434, filed on even date herewith, entitled "MRAM With Magnetic Via For Storage of Information and Field Sensor," having Utility patent application Ser. No. 10/923,639, filed on even date herewith, entitled "MRAM With Vertical Storage Element in Two Layer-Arrangement and Field Sensor," having and is commonly assigned to the same assignee as the present invention, and which is herein incorporated by reference.

FIELD OF THE INVENTION

This invention relates to non-volatile semiconductor memory devices, and more particularly, relates to magnetic memory elements and a magnetic random access memory (MRAM) device comprising said memory elements for use in a semiconductor integrated circuit.

BACKGROUND

Magnetic (or magneto-resistive) random access memory (MRAM) is a non-volatile access memory technology that could potentially replace the dynamic random access memory (DRAM) as the standard memory for computing devices. Particularly, the use of MRAM-devices as a non-volatile RAM will eventually allow for "instant on"-systems that come to life as soon as the computer system is turned on, thus saving the amount of time needed for a conventional computer to transfer boot data from a hard disk drive to volatile DRAM during system power up.

A magnetic memory element (also referred to as a tunneling magneto-resistive or TMR-device) includes a structure having ferromagnetic layers separated by a non-magnetic layer (barrier) and arranged into a magnetic tunnel junction (MTJ). Digital information is stored and represented in the magnetic memory element as directions of magnetization vectors in the ferromagnetic layers. More specifically, the magnetic moment of one ferromagnetic layer is magnetically fixed or pinned (also referred to as a "reference layer"), while the magnetic moment of the other ferromagnetic layer (also referred to as "free layer") is free to be switched between the same and opposite directions with respect to the fixed magnetization direction of the reference layer. The orientations of the magnetic moment of the free layer are also known as "parallel" and "anti-parallel" states, respectively, wherein a parallel state refers to the same magnetic alignment of the free and reference layers, while an anti-parallel state refers to opposing magnetic alignments therebetween.

Depending upon the magnetic states of the free layer (i.e., parallel or anti-parallel states), the magnetic memory element exhibits two different resistance values in response to a voltage applied across the magnetic tunnel junction barrier. The particular resistance of the TMR-device thus reflects the magnetization state of the free layer, wherein its resistance is "low" when the magnetization is parallel, and "high" when the magnetization is anti-parallel. Accordingly, a detection of changes in resistance allows a MRAM-device to provide information stored in the magnetic memory element, that is to say to read information from the magnetic memory element. In addition, a magnetic memory element is written to through the application of a bi-directional current in a particular direction, in order to magnetically align the free layer in a parallel or anti-parallel state.

An MRAM-device integrates a plurality of magnetic memory elements and other circuits, such as a control circuit for magnetic memory elements, comparators for detecting states in a magnetic memory element, input/output circuits and miscellaneous support circuitry. As such, there are certain microfabrication processing difficulties to be overcome before high capacity/density MRAM-devices become commercially available. For example, in order to reduce the power consumption of the MRAM-device and provide a variety of support functions CMOS-technology is required. As is known in the art, various CMOS processing steps are carried out at relatively high temperatures, while ferromagnetic materials employed in the fabrication of MRAM-devices require substantially lower process temperatures. Thus, the magnetic memory elements typically are designed to be integrated into the back end wiring structure of back-end-of-line (BEOL) CMOS processing following front-end-of-line (FEOL) CMOS processing.

To be useful in present day electronic devices, very high density arrays of magnetic memory cells are utilized in magnetic random access memories. In these high density arrays the magnetic cells are generally arranged in rows and columns, with individual cells being addressable for reading and writing operations by the selection of an appropriate row and column containing the desired cell. Also, conveniently, orthogonal current lines are provided, one for each row and one for each column so that a selected cell is written by applying current to the appropriate row current line and the appropriate column current line.

Recently, and especially in view of modern portable equipment, such as portable computers, digital still cameras and the like, the demand of low-cost and particularly high-density mass storage memories has increased dramatically. Therefore, one of the most important issues for low-cost and high-density MRAM-devices is a reduction of the MRAM-cell size. However, down-scaling MRAM-cells requires smaller and smaller magnetic tunnel junctions and, therefore, a lot of severe problems arise, since for a given aspect ratio and free layer thickness the activation energy, being dependent on the free layer volume, scales down like w, where w is the width of the magnetic cell. Otherwise, the switching fields increase roughly like 1/w. Thus, in scaling down a MRAM-cell field selected switching becomes ever harder, but at the same time the magnetic cell looses its information more and more rapidly due to thermal activation.

In light of the above, there is a need to provide a magnetic memory element and magnetic random access memory (MRAM) device comprising such magnetic memory elements enabling a cell-size down-scale without thereby causing severe problems with respect to an increase of switching-fields and decrease of activation energy.

SUMMARY

A magnetic memory element comprising a magnetic storage element having at least one magnetic layer made of a magnetic material and being vertically oriented relative to a wafer surface on which the magnetic memory element is formed, the magnetic layer having a magnetic anisotropy with its magnetization vector being magnetically coupled to at least one current line, and a magnetic sensor element for sensing the magnetization of the at least one magnetic layer of the magnetic storage element comprising at least one magnetic layer having a magnetization vector being magnetically coupled to the magnetization vector of the at least one magnetic layer of the magnetic storage element, the magnetic sensor element being conductively coupled to the at least one current line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
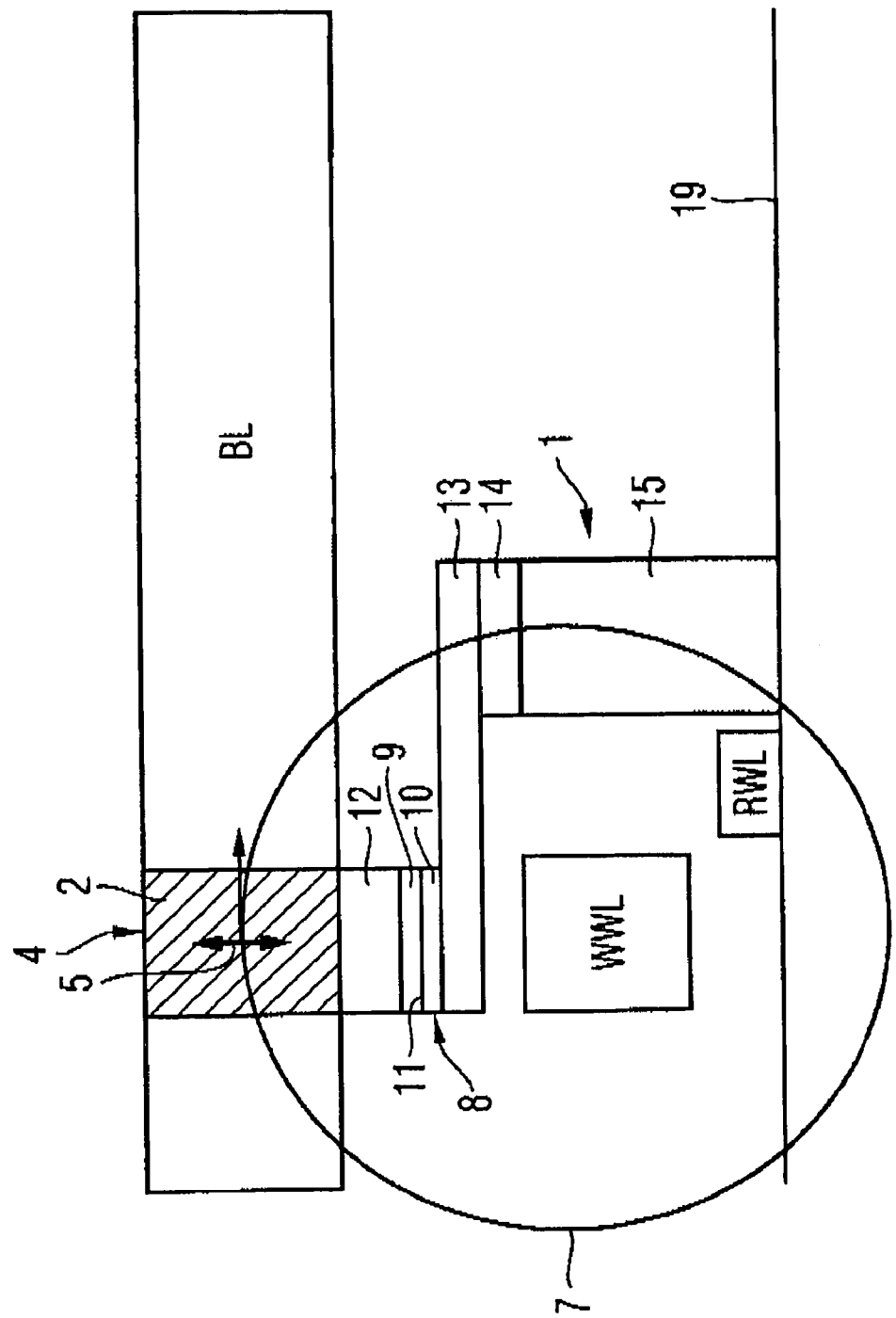
FIG. 1 is a schematic diagram of a vertical cross-sectional view Sectioned along a bit line illustrating one embodiment of a magnetic memory element of the invention.
Figure 2:
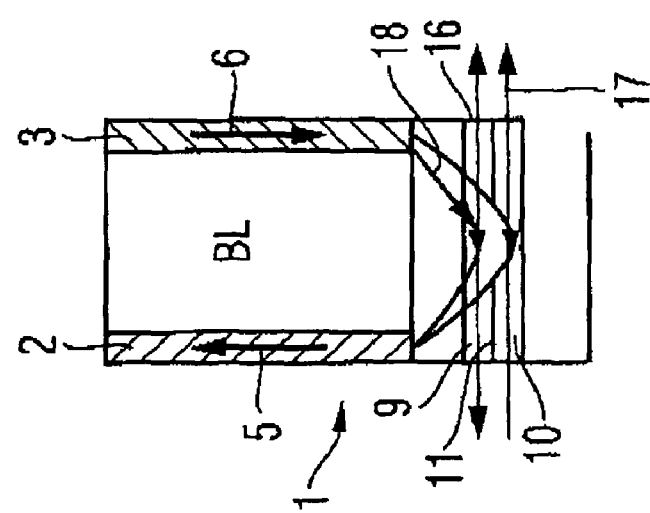
FIG. 2 is a schematic diagram illustrating a vertical cross-sectional view sectioned along the write word line of the embodiment of the magnetic memory element of FIG. 1.

FIGS. 1 and 2 illustrate one embodiment of a magnetic memory element, generally at 1. Now referring to FIGS. 1 and 2, which are schematic, vertically cut, cross-sectional views sectioned along the bit line (BL) and write-word line (WWL), respectively, one embodiment of the magnetic memory element of the invention is explained. Based on a FET memory cell with liner along the BL, the magnetic memory element 1 comprises a magnetic storage element 4 consisting of two magnetic layers 2 and 3, which are made up of a ferromagnetic material, which may be conductive or not. Both magnetic layers 2, 3 are positioned in intimate contact to the bit line (BL) on opposite sides of it in a parallel relationship, that is to say the bit line is sandwiched in between both magnetic layers 2, 3.

Each of the magnetic layers 2, 3 is in a vertical orientation relative to the surface of a wafer 19 on which the magnetic memory element is formed, and is provided with magnetic shape anisotropy, by appropriately choosing its aspect ratio, such that its height, i.e., dimension in a direction perpendicular to the wafer 19 surface, is slightly larger than its width, i.e., its dimension in a direction parallel to the wafer 19 surface, and is chosen to be larger than 1 and especially in the range of 1,5 to 3, and especially amount to approximately 2. The shape anisotropy of both magnetic layers 2, 3 thus is perpendicularly oriented to the wafer 19 surface. As result, magnetization vectors 5, 6 of both magnetic layers 2, 3 may be switched between the two directions perpendicularly aligned to the wafer 4 surface in response to external magnetic fields coupled therewith.

The magnetization vectors 5, 6 of both magnetic layers 2, 3 are in an anti-parallel relationship, illustrated in FIG. 2, both of which thus forming a flux-closed pair, so that magnetic interference between adjacent magnetic storage elements may be avoided. The magnetic layers 2, 3, more precisely its magnetization vectors 5, 6 are magnetically coupled to the magnetic field of the BL and to the magnetic field of a write word line (WWL) arranged underneath of it. The WWL creates a magnetic field 7 in the planes of the magnetic layers 2, 3 of the magnetic storage element, while the BL creates a magnetic field (not shown in the figures) substantially perpendicular to the planes of the magnetic layers 2, 3 of the magnetic storage element. For switching both magnetization vectors 5, 6 typically the Stoner-Wohlfahrt switching scenario may be used with the WWL underneath the magnetic layers 2, 3 that creates the hard axis field, which switching scenario is well-known to the skilled persons and therefore need not be explained in further details here.

The magnetic memory element 1 further comprises a horizontal magnetic sensor element 8 as magnetic field sensor being arranged separately from the magnetic storage element for sensing magnetization of the magnetic storage element, which is conductively interposed between BL and a selection device (not illustrated) formed in wafer 4 by way of a series connection comprised in that order of a via 12, which is connected to the BL and magnetic sensor element 8 and for example is made of TaN, the magnetic sensor element 8 itself, a conductive layer 13 for a lateral shift of the series connection, which for example is made of TaN, and further vias 13, 15, for example made of TaN, the latter being connected to the selection device. For sensing information of the magnetic storage element, magnetic sensor element 8 is magnetically coupled to the magnetic layers 2, 3 of the magnetic storage element.

The magnetic sensor element is realized as a magnetic tunnel junction (MTJ) having an aspect ratio of about 1, which comprises two ferromagnetic layers 9 and 10 of magnetic material stacked in parallel, overlying relationship and are separated by a layer of nonmagnetic material 11. As is illustrated in FIG. 2, ferromagnetic layer 10 is designed to be a reference layer, the magnetic moment 17 of which being pinned, while the ferromagnetic layer 9 is designed to be a free layer, the magnetic moment 16 of which being free to be switched between the same and opposite directions with respect to the pinned magnetization direction of the reference layer. The orientation of the magnetic moment of the free layer thus may be switched between its parallel and anti-parallel states, in response to the magnetic stray field 18 of the magnetic layers 2, 3 of the magnetic storage element, which is seen by the MTJ. Due to an aspect ratio of about 1, magnetic moment 16 of the free layer can be switched between its parallel and anti-parallel states according to the stray field 18 associated with different orientations of magnetization vectors 5, 6 of the magnetic layers 2, 3 of the magnetic storage element.

Since the MTJ exhibits two different resistance values in response to a voltage applied across the MTJ-barrier, information stored in the magnetic storage element may be read out by a sense current, which flows between BL and selection device. Reading out parallel and anti-parallel states of the MTJ, a read word line (RWL) is provided for.

Figure 3:
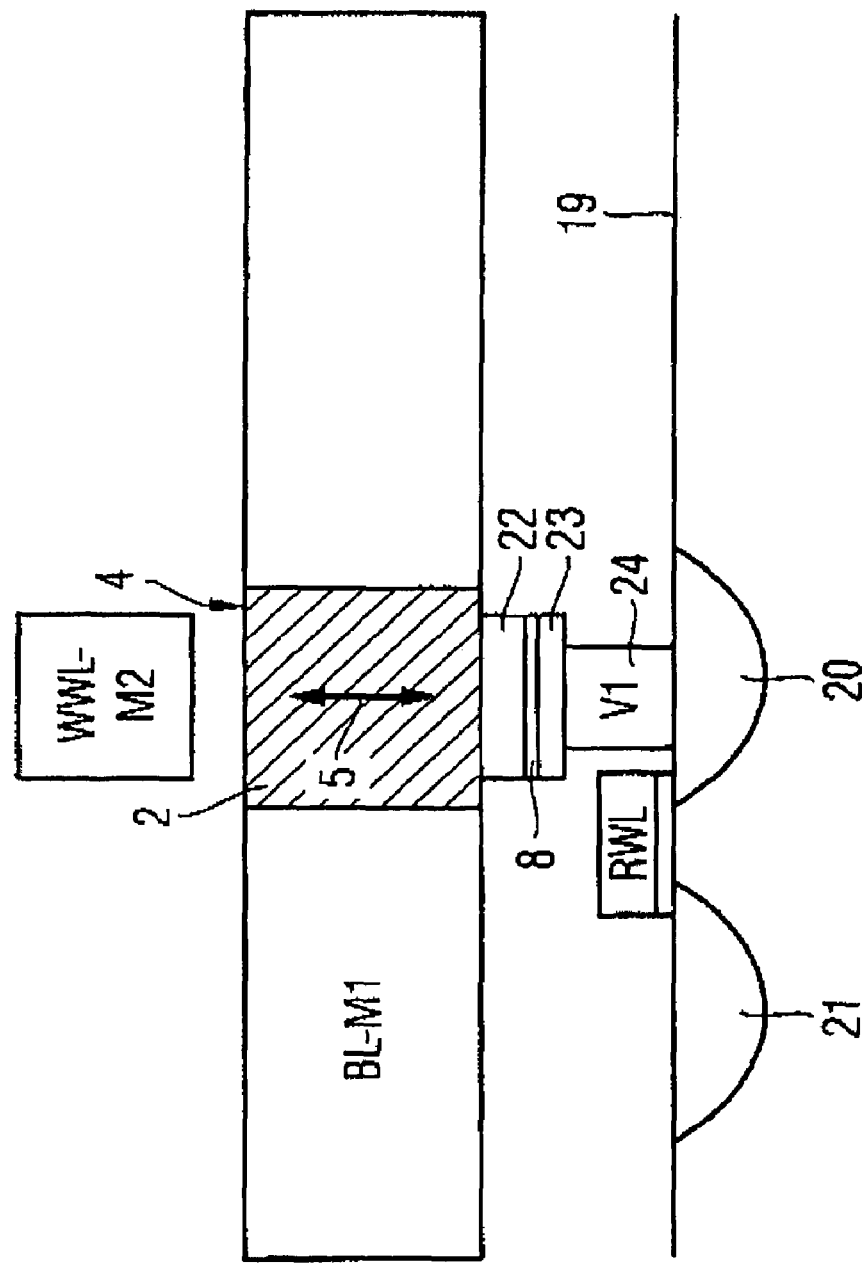
FIG. 3 is a schematic vertical cross-sectional view showing a second embodiment of the magnetic memory element of the invention.
Figure 4:
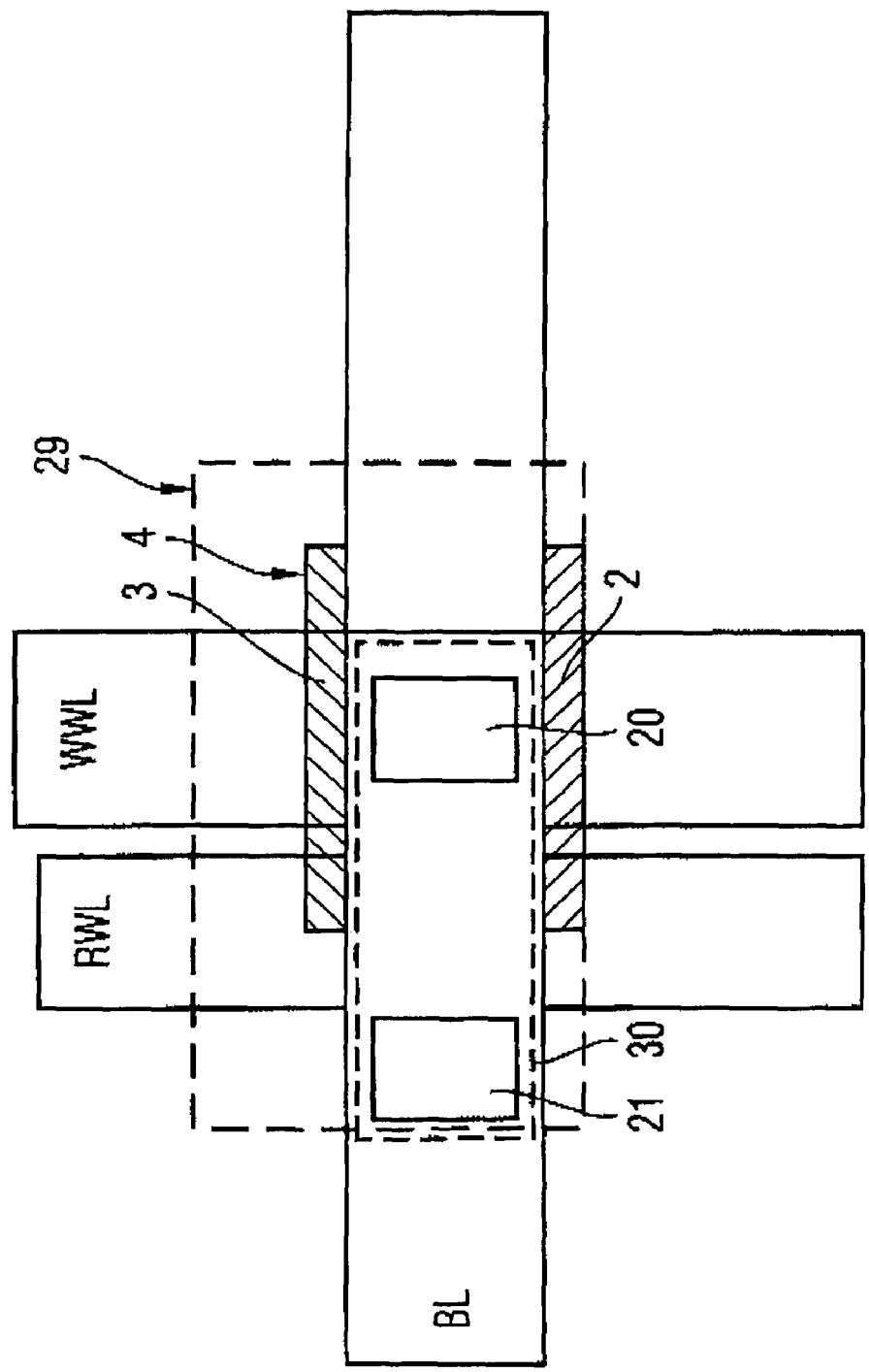
FIG. 4 is a schematic diagram illustrating a horizontal cross-sectional view according to the embodiment of the magnetic memory element illustrated in FIG. 3.
Figure 5:
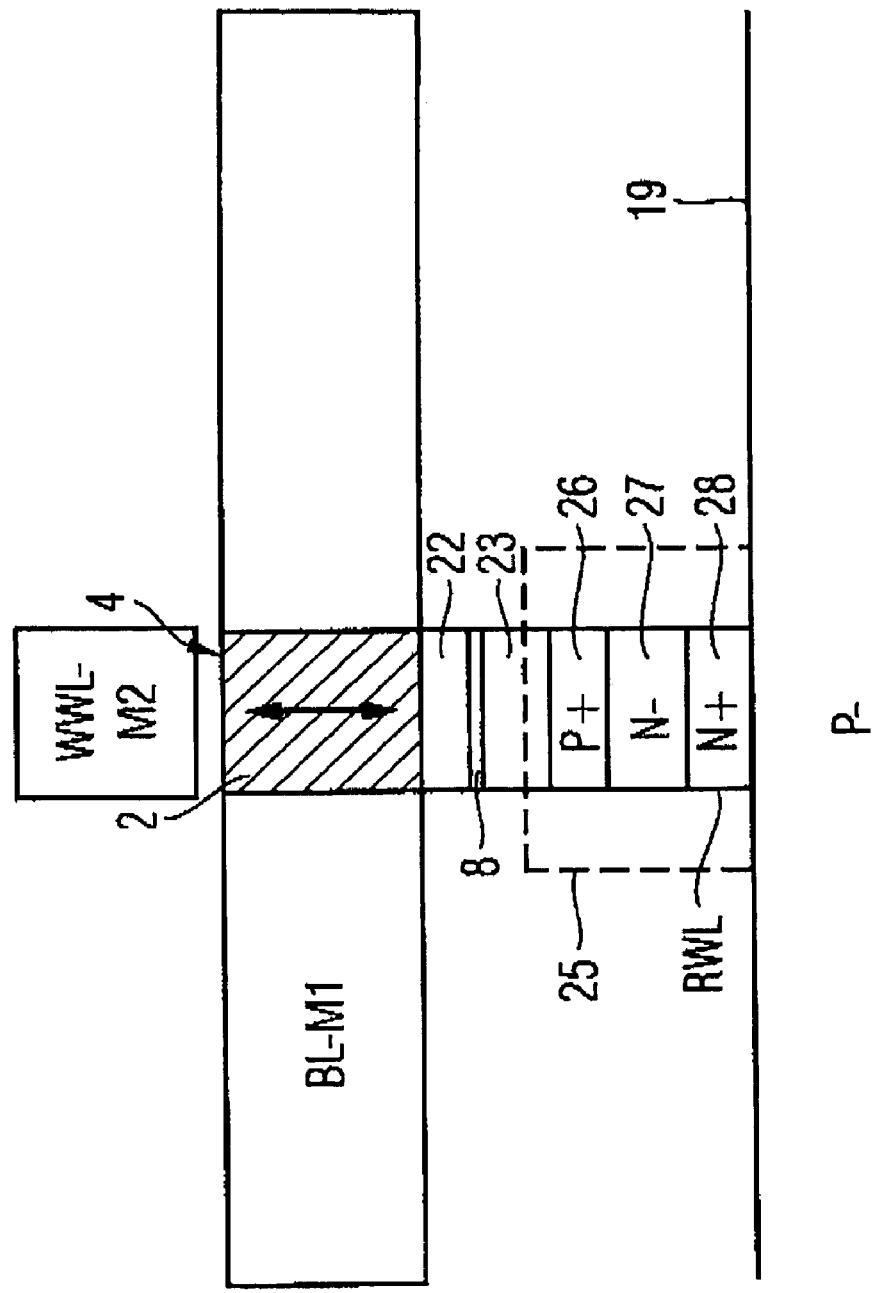
FIG. 5 is a schematic diagram of a vertical cross-sectional view illustrating another embodiment of a magnetic memory element of the invention.

Now referring to FIGS. 3 to 5, second and third embodiments of the magnetic memory element of the invention are explained. In order to avoid unnecessary repetitions only the differences to the above-described first embodiment will be explained, while otherwise reference is made to the explanations made relating to the first embodiment.

Firstly, reference is made to FIGS. 3 and 4, illustrating a schematic vertical cross-sectional view and a schematic horizontal cross-sectional view, respectively, of a second embodiment of the magnetic memory element of the invention. In the second embodiment of the invention the MTJ 8 is arranged to have a straight vertical electrical contact to the selection device, which in the second embodiment is realized as a FET-transistor 30 having source 21 and drain 20. Electrical contact between MTJ 8 and drain 20 is realized by vias 22, 23 and 24, the first one being in electrical contact with BL in the first metallization (M1), while the latter one being in contact with drain 20. Such arrangement is advantageous in that the lateral dimension of the memory element size may be reduced to a minimum. In order to have a straight electrical contact between MTJ 8 and drain 20, the WWL has been arranged above MTJ 8 corresponding to a second metallization (M2).

Referring to FIG. 4 a magnetic memory element (unit cell) 29 in FET architecture is illustrated (dashed). Also, in FIG. 4 FET transistor 30 comprising source 21 and drain 20 contact is illustrated (dashed). As can be seen from FIG. 4, the unit cell may be realized in about 4 F length and about 2 F width, thus resulting in a 8 $F^2$ structure, while the magnetic storage element 4 can be substantially wider than 1 F without increasing the cell size, independent of the size of the MTJ 8, which can be kept at 1 $F^2$.

Reference is made to FIG. 5, illustrating a schematic vertical cross-sectional view along the bit line of a third embodiment of the magnetic memory element of the invention. Analogous to the second embodiment of the invention, in the third embodiment of it the MTJ 8 is arranged to have a straight vertical electrical contact to the selection device. However, contrary to the second embodiment, the selection device is realized as 4 $F^2$ diode cell 25 comprised of $P^+$-layer 26, $N^-$-layer 27 and $N^+$-layer 28. $N^+$-layer 28 may be identified as RWL.

According to one embodiment of the invention, magnetic memory element 1, comprises a magnetic storage element and a magnetic sensor element, which may be provided in spatial distance from the magnetic storage element or be in contact therewith, and at least one current line, typically a number of three, which may be identified by a bit line, a write word line and read word line, respectively. As in the convenient case of MRAM-cells, the magnetic memory element 1 of the present invention is formed on a wafer surface.

The magnetic storage element of the magnetic memory element 1 of the invention comprises at least one magnetic layer, which is made of a (ferro-) magnetic material, such as Ni, Fe, Co and their alloys, and is vertically oriented relative to the wafer surface on which the magnetic memory element is formed. This magnetic layer of the magnetic storage element is provided with magnetic anisotropy, which may be realized by appropriately choosing its aspect ratio and/or by intrinsic anisotropy, as is well-known to those skilled in the art. Particularly, the height of the magnetic layer of the magnetic storage element may be chosen to be slightly larger than its width so as to give the magnetic layer a finite aspect ratio in vertical direction and thus shape anisotropy with a preferred direction perpendicular to the wafer surface. Intrinsic magnetic anisotropy may be combined with magnetic shape anisotropy.

In one embodiment of the present invention, the magnetization vector of the magnetic layer of the magnetic storage element is magnetically coupled to the at least one current line, and, in a typical and preferable arrangement of the invention, is magnetically coupled to two current lines, which may be identified by the bit line and the (write) word line, respectively. The magnetization vector of the magnetic layer of the magnetic storage element, in accordance with its magnetic anisotropy, is preferably oriented substantially perpendicular relative to the wafer surface.

For magnetically coupling the magnetization vector of the at least one magnetic layer of the magnetic storage element to the magnetic field of the at least one current line, the former is preferably positioned adjacent or at least close to said at least one current line, which typically and preferably may be identified by the bit line. It especially may be advantageous if said magnetic storage element is positioned to be in contact with said at least one current line.

According to a preferred embodiment of the invention, the magnetic storage element comprises two magnetic layers 2, 3, which are positioned to be on opposite sides of said at least one current line (e.g., bit line) in a parallel relationship. Particularly, it may be of an advantage if the current line is sandwiched in between said two magnetic layers 2, 3 of said magnetic storage element, that is to say both magnetic layers 2, 3 are positioned to be in contact with the current line.

Providing for two magnetic layers 2, 3 on opposite sides of the current line in a parallel relationship with the current line in particular being sandwiched in between, offers the advantage to enable a substantially magnetic flux closed pair. To this aim, the magnetization vectors of both magnetic layers 2, 3 of the magnetic storage element constituting a magnetic flux closed pair necessarily are in an anti-parallel magnetization configuration.

Digital information stored in the magnetic storage element is read out by the magnetic sensor element that senses the magnetization of the at least one magnetic layer of the magnetic storage element. To this aim, the magnetic sensor element of the magnetic memory element 1 of the invention comprises at least one magnetic layer, made of a magnetic material, the magnetization vector of which being magnetically coupled to the magnetization vector of the at least one magnetic layer of the magnetic storage element. Magnetic coupling between the at least one magnetic layer of the magnetic storage element and the magnetic sensor element may be realized via a magnetic stray field of the at least one magnetic layer of the magnetic storage element seen by the magnetic sensor element. In that case, in order to provide for sufficient magnetic coupling between magnetic storage and magnetic sensor elements, the magnetic sensor element has to be positioned within the magnetic stray field of the magnetic storage element, such that the magnetization vector of the magnetic layer of the magnetic sensor element may be sufficiently influenced, and particularly is able to follow the magnetization vector of the at least one magnetic layer of the magnetic storage element. To this aim, the magnetic sensor element typically is placed in the vicinity of the magnetic storage element. Alternatively, magnetic coupling between the at least one magnetic layer of the magnetic storage element and the magnetic sensor element may also be realized via magnetic exchange coupling, in which case the magnetic storage element and the magnetic sensor element are brought into contact. It is particularly preferred if the at least one magnetic layer of the magnetic sensor element is provided with magnetic anisotropy with its magnetization to be free to be switched between parallel and anti-parallel directions with respect to the direction of the magnetic anisotropy. Parallel and anti-parallel directions of the magnetization of the at least one magnetic layer of the magnetic sensor element preferably are associated with different electric resistance values exhibited by the magnetic sensor element.

The magnetic sensor element of the magnetic memory element 1 of the invention is conductively connected to the at least one current line. Particularly, it may be conductively connected to an active structure, that is to say a selection device of the wafer, like a FET-transistor, diode and the like. Alternatively, in realizing a typical "cross-point-architecture", it may also be conductively connected to two current lines, wherein the first one of which may typically be identified as bit line, while the other one may typically be identified as word line.

The magnetic sensor element preferably is realized as a magnetic tunnel junction, which comprises two magnetic layers made of magnetic material stacked in parallel, overlying relationship and is separated by a layer of nonmagnetic material. More specifically, the magnetic moment of one ferromagnetic layer ("reference layer") is magnetically fixed or pinned, while the magnetic moment of the other ferromagnetic layer ("free layer") is free to be switched between the same and opposite directions with respect to the fixed magnetization direction of the reference layer. Depending upon the magnetic states of the free layer (i.e., parallel or anti-parallel states), the magnetic sensor element exhibits two different resistance values in response to a voltage applied across the magnetic tunnel junction barrier. The particular resistance of the magnetic sensor element thus reflects the magnetization state of the free layer in response to the sensed magnetization of the magnetic storage element magnetically coupled therewith, wherein resistance is "low" when the magnetization of the free layer is parallel to the magnetization of the reference layer, and "high" when the magnetization is anti-parallel. Accordingly, a detection of changes in resistance allows such magnetic sensor element to provide information stored in the magnetic storage element, that is to say, to read information from the magnetic storage element.

In the magnetic memory element 1 of the invention the magnetic layer of the magnetic sensor element is substantially parallel to the wafer surface, that is to say the magnetic layer with its magnetization vector oriented in that plane is horizontally aligned.

As has already been detailed above, the magnetic sensor element of the magnetic memory element of the invention may be conductively interposed between the at least one current line, which may be identified as bit line, and a selection device. In other words, an electrical series connection comprising the at least one current line, magnetic sensor element and selection device in that order is established. Alternatively, the magnetic sensor element of the magnetic memory element of the invention may be conductively interposed between two current lines, which may be identified as bit line and word line, respectively, In other words, an electrical series connection comprising bit line, magnetic sensor element and word line in that order is established.

The magnetic sensor element of the invention can have an arbitrarily chosen shape, for instance circle, round, square with rounded edges and the like.

In one preferred embodiment of the invention, the magnetic storage element is arranged above the magnetic sensor element. In such arrangement, in view of magnetic coupling between magnetic storage element and current lines, it may be advantageous to arrange the magnetic sensor element in between a first current line, which typically may be identified by a bit line, and a second current line, which typically may be identified by a write word line.

In another preferred embodiment of the invention, the magnetic sensor element is arranged to have a straight vertical electrical contact to the selection device, or alternatively (in cross-point architecture) the current line, which straight vertical electrical contact may typically be realized by an electrical via, that is to say a via filled with conductive material. Such embodiment advantageously allows for a minimum required space for its realization. In that case, it may also be preferable to position the first current line, which typically may be identified by a bit line, in between two layers of the magnetic storage element, while a second current line is provided vertically above the magnetic storage element.

In one embodiment of the invention an aspect ratio of the at least one magnetic layer of the magnetic storage element preferably is chosen to be larger than 1, and may particularly be in the range of from 1.5 to 3 in order to provide for a sufficiently high magnetic shape anisotropy.

In general, in order to provide for a sufficiently precise sensing of the magnetization of the magnetic storage element, the magnetic anisotropy of the magnetic layer of the magnetic sensor element has to be chosen to be smaller than that one of the at least one magnetic layer of the magnetic storage element. While, basically, shape anisotropy may be combined with intrinsic anistropy, i.e., shape anisotropy may be (partially) compensated or added by intrinsic anisotropy, it is clear that it is the resulting total magnetic anisotropy that has to be chosen to be smaller than that one of the at least one magnetic layer of the magnetic storage element. To this aim, it may be preferable to choose an aspect ratio of the magnetic layer of the magnetic sensor element, which is in the range of from 1 to 2, and more preferably amounts to approximately 1.

Scaling down the magnetic memory element 1 of the present invention, such memory element may be realized in approximately 8 $F^2$ structure size, wherein F is the minimum lithographic feature size, which at present using (UV) photolithographic methods amounts to about 90 nm. Otherwise, independently from the size of the magnetic memory element as such, the magnetic sensor element may preferably be realized in about 1 $F^2$ structure size.

According to another embodiment of the invention, it concerns a magnetic random access memory device, which comprises a plurality of magnetic memory elements as above-described. In a preferred realization, the magnetic random access memory device comprises a plurality of first current lines and plurality of second current lines, wherein each of the magnetic memory elements is magnetically coupled to one of the first current lines and one of the second current lines. Furthermore, each of the magnetic sensor elements of the magnetic memory elements may be conductively interposed between the one of the first and second current lines and a selection device. Alternatively, each of the magnetic sensor elements of the magnetic memory elements may be conductively interposed between the one of said first current lines and the one of said second current lines.

Here, and in accordance with its typical usage, the term "aspect ratio" denotes a ratio of orthogonal dimensions which span the magnetization vector's plane, which in a vertically oriented plane may be identified by a ratio of its height to its width, and in a horizontally oriented plane may be identified by a ratio of its length to its width. Needless to say, here, and in accordance with its typical usage, the term "vertical" relates to the plane of the wafer surface and thus denotes a direction perpendicularly oriented to the wafer surface, while the term "horizontal" denotes a direction parallelly oriented to the wafer surface.

With the above magnetic memory element 1, and in contrast to conventional MRAM-cells where magnetic storage element and magnetic field sensor are both incorporated in the free layer of one and the same magnetic tunneling junction, it is possible to store information in the magnetic polarization of the magnetic storage element, while the readout is done in a separate magnetic sensor element, for example a magnetic tunneling junction, which may be spatially distanced from the magnetic storage element or be in contact therewith. Since the magnetic sensor element, which just serves as field sensor, is separated from the magnetic storage element, it can be realized arbitrarily small. Contrary to the magnetic storage element being vertically oriented, the magnetic sensor element can be horizontally oriented and, thus, can be produced with conventional thin layer deposition and patterning technology. The horizontal magnetic sensor element can be made very small and have an aspect ratio of about 1. It, however, should have a lower magnetic anisotropy than the magnetic storage element to follow the magnetic field arising from the vertical magnetic storage element. Otherwise, the aspect ratio and thus the switching field (in case that shape anisotropy is used) of the vertically aligned magnetic storage element can be controlled by the depth of the trench to be etched for its realization.

Thus, the actual magnetic storage element can be made rather large, in particular with a large enough volume to prevent thermally activated switching. As for the magnetic sensor element for sensing the magnetic stray field of the magnetic storage element, its activation energy is given by the Zeeman energy difference $2HM_SV$, where H is the magnetic stray field from the magnetic storage element seen by the magnetic sensor element, $M_S$ is its saturation magnetization, and V the volume of its free layer. In general, the whole structure of the magnetic storage element, which may be comprised of two magnetic layers, and the magnetic sensor element can be optimized as a whole in terms of switching fields and activation energy to the lowest lying erroneous state.

The interaction between magnetic storage elements is strongly reduced as first of all the magnetic field points mostly perpendicular to the wafer surface, provided that the magnetic anisotropy is perpendicularly oriented to the wafer surface, and may also be very well flux-closed. As for the magnetic sensor elements, their magnetic moments and thus interaction is very small as they may be realized to have only a small total magnetic moment, due to an aspect ratio near 1.

It shall be emphasized, that the vertical magnetic storage element can be made substantially wider than 1 F without increasing the magnetic memory element size, independent of the size of the actual planar, horizontal magnetic memory element which can be kept at 1 $F^2$. Thus, for example, in a F=90 nm lithography technology and FET-architecture, the magnetic sensor element can be made easily 180 nm wide or more (and e.g., 360 nm deep, 5 nm thick, i.e., about the size of a nowadays 180 nm technology cell), as the unit memory cell has at best 4 F in the long direction (assuming DRAM technology transistors with basically no contact overhead). Thus, there is still a space of 2 F=180 nm between neighboring magnetic memory elements on the same bit line.

Furthermore, the spacing of the magnetic storage elements is less critical than for planar elements, as they do not interact unless written (the magnetization vector is perpendicular to the wafer plane). In the case of drain contact sharing, the length of the memory unit cell possibly shrinks to 3 F (again assuming zero overhead for contacts), and so a 2 F vertical magnetic storage element has still 1 F spacing.

The magnetic storage elements of the magnetic memory elements of the invention can be produced with the regular liner process plus an additional patterning in a first current line (e.g., bit line) direction. This can be done by patterning the liner before filling the trench with a conductive material such as copper. For better image reproduction, it might be useful to fill the trench with an easily etchable material such as an insulating material, to then chemically-mechanically polish the whole structure, and then pattern a resist on top of the flat surface and etching out the fill material and the liner where it is not desired. In any case, the liner patterning should be done after etching out the bottom, so that only the side walls remain.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetic memory element comprising:
    a magnetic storage element having at least one magnetic layer made of a magnetic material and being vertically oriented relative to a wafer surface on which the magnetic memory element is formed, the magnetic layer having a magnetic anisotropy with its magnetization vector being magnetically coupled to at least one current line; and
    a magnetic sensor element for sensing the magnetization of the at least one magnetic layer of the magnetic storage element comprising at least one magnetic layer having a magnetization vector being magnetically coupled to the magnetization vector of the at least one magnetic layer of the magnetic storage element, the magnetic sensor element being conductively coupled to the at least one current line.

2. The magnetic memory element of claim 1, wherein the magnetic sensor element is arranged to be spatially distanced from the magnetic storage element.

3. The magnetic memory element of claims 1, wherein the magnetic sensor element is conductively coupled to a selection device.

4. The magnetic memory element of claim 1, wherein the magnetic sensor element is conductively coupled to two current lines, one of which being a bit line and the other one being a word line.

5. The magnetic memory element of claim 1, wherein the at least one magnetic layer of the magnetic storage element is positioned adjacent the at least one current line.

6. The magnetic memory element of claim 5, wherein the at least one magnetic layer of the magnetic storage element is positioned to be in contact with the at least one current line.

7. A magnetic memory element comprising:
a magnetic storage element having at least one magnetic layer made of a magnetic material and being vertically oriented relative to a wafer surface on which the magnetic memory element is formed, the magnetic layer having a magnetic anisotropy with its magnetization vector being magnetically coupled to at least one current line; and
a magnetic sensor element for sensing the magnetization of the at least one magnetic layer of the magnetic storage element comprising at least one magnetic layer having a magnetization vector being magnetically coupled to the magnetization vector of the at least one magnetic layer of the magnetic storage element, the magnetic sensor element being conductively coupled to the at least one current line,
wherein the magnetic anisotropy of the magnetic layer of the magnetic storage element is oriented substantially perpendicular relative to the wafer surface.

8. The magnetic memory element of claim 7, wherein the magnetic storage element comprises two magnetic layers arranged on opposite sides of the at least one current line in a parallel relationship.

9. The magnetic memory element according to claim 7, wherein the current line is sandwiched in between the two magnetic layers of the magnetic storage element.

10. The magnetic memory element of claims 9, wherein the magnetization vectors of the two magnetic layers of the magnetic storage element form a substantially magnetic flux closed pair.

11. A magnetic memory element comprising:
a magnetic storage element having at least one magnetic layer made of a magnetic material and being vertically oriented relative to a wafer surface, the magnetic layer having a magnetic anisotropy with its magnetization vector being magnetically coupled to at least one current line; and
a magnetic sensor element for sensing the magnetization of the at least one magnetic layer comprising at least one magnetic layer having a magnetization vector being magnetically coupled to the magnetization vector of the at least one magnetic layer of the magnetic storage element, the magnetic sensor element being conductively coupled to the at least one current line.

12. The magnetic memory element of claim 11, wherein the magnetic layer of the magnetic sensor element is substantially parallel relative to the wafer surface.

13. The magnetic memory element of claim 11, wherein the magnetic sensor element is a magnetic tunnel junction comprising two magnetic layers of magnetic material stacked in parallel, overlying relationship and separated by a layer of nonmagnetic material.

14. The magnetic memory element of claim 11, wherein the magnetic storage element is arranged above the magnetic sensor element.

15. The magnetic memory element of claim 11, wherein the magnetic sensor element is arranged in between a first current line and a second current line.

16. The magnetic memory element of claim 11, wherein the magnetic sensor element has a straight vertical electrical contact to the selection device.

17. The magnetic memory element of claim 11, wherein a first current line is arranged in between two layers of the magnetic storage element and a second current line is provided above the magnetic storage element.

18. The magnetic memory element of claim 11, wherein the magnetic sensor element has a straight vertical electrical contact to at least one of the current lines.

19. The magnetic memory element of claim 11, wherein an aspect ratio of the at least one magnetic layer of the magnetic storage element is larger than 1, and particularly is in the range of from 1.5 to 3.

20. The magnetic memory element of claim 11, wherein an aspect ratio of the magnetic layer of the magnetic sensor element is in the range of from 1 to 2, and more preferably amounts to about 1.

21. The magnetic memory element of claim 11, wherein the magnetic memory element is realized in about 8 $F^2$ structure size.

22. The magnetic memory element of claim 11, wherein the magnetic sensor element is realized in about 1 $F^2$ structure size.

23. A magnetic random access memory device comprising:
a plurality of magnetic memory elements comprising a magnetic storage element having at least one magnetic layer made of a magnetic material and being vertically oriented relative to a wafer surface on which the magnetic memory element is formed, the magnetic layer having a magnetic anisotropy with its magnetization vector being magnetically coupled to at least one current line, and a magnetic sensor element for sensing the magnetization of the at least one magnetic layer of the magnetic storage element comprising at least one magnetic layer having a magnetization vector being magnetically coupled to the magnetization vector of the at least one magnetic layer of the magnetic storage element the magnetic sensor element being conductively coupled to the at least one current line.

24. The magnetic random access memory device of claim 23, comprising a plurality of first and second current lines, wherein each of the magnetic memory elements is magnetically coupled to one of the first current lines and one of the second current lines and wherein each of the magnetic sensor elements is conductively coupled to one of the first or second current lines and a selection device.

25. The magnetic random access memory device according to claim 23, comprising a plurality of first and second current lines, wherein each of the magnetic memory elements is magnetically coupled to one of the first current lines or one of the second current lines and wherein each of the magnetic sensor elements is conductively coupled to one of the first or second current lines and the other one of the first or second current lines.

* * * * *